United States Patent
Ha et al.

(10) Patent No.: US 9,070,646 B2
(45) Date of Patent: Jun. 30, 2015

(54) ORGANIC LIGHT EMITTING DISPLAY DEVICE

(71) Applicant: LG Display Co., Ltd., Seoul (KR)

(72) Inventors: Won Kyu Ha, Paju-si (KR); Bum Sik Kim, Suwon-si (KR); Kil Hwan Oh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/685,083

(22) Filed: Nov. 26, 2012

(65) Prior Publication Data
US 2013/0140537 A1    Jun. 6, 2013

(30) Foreign Application Priority Data
Dec. 1, 2011  (KR) .......................... 10-2011-0127987

(51) Int. Cl.
*H01L 29/08*    (2006.01)
*H01L 27/32*    (2006.01)
*G09G 3/32*    (2006.01)

(52) U.S. Cl.
CPC .......... *H01L 27/3262* (2013.01); *G09G 3/3233* (2013.01); *G09G 2300/0809* (2013.01); *G09G 2300/0819* (2013.01); *G09G 2300/0842* (2013.01); *G09G 2300/0861* (2013.01); *G09G 2310/0251* (2013.01); *G09G 2310/0262* (2013.01); *G09G 2320/0233* (2013.01); *G09G 2320/043* (2013.01); *G09G 2330/021* (2013.01)

(58) Field of Classification Search
CPC ....................................................... H01L 29/08
USPC ................... 257/40; 313/486, 500, 505–507; 345/76, 77, 82
See application file for complete search history.

(56) References Cited

U.S. PATENT DOCUMENTS

| 7,535,442 B2 | 5/2009 | Yamashita et al. |
| 7,817,120 B2 | 10/2010 | Peng et al. |
| 2007/0024541 A1* | 2/2007 | Ryu et al. .................. 345/76 |
| 2009/0027310 A1* | 1/2009 | Kim ............................. 345/76 |

FOREIGN PATENT DOCUMENTS

| KR | 10-2011-0013693 A | 2/2011 |
| KR | 10-2011-0078787 A | 7/2011 |

OTHER PUBLICATIONS

German Patent and Trademark Office, Office Action, German Patent Application No. 10 2012 111 634.2, May 20, 2014, thirteen pages.

* cited by examiner

*Primary Examiner* — Matthew Gordon
(74) *Attorney, Agent, or Firm* — Fenwick & West LLP

(57) ABSTRACT

Disclosed is an organic light-emitting display device defined into a non-display area and a display area which is provided with pixels. Each of the pixels includes: first through fourth nodes; an organic light emission element connected to the fourth node; a drive transistor disposed between the second, third, and fourth nodes and configured to generate a drive current which drives the organic light emission element to emit light; a storage capacitor disposed between the first and third nodes; first through fifth transistors; wherein the fifth transistor is disposed between the second node with the non-display area and a reference voltage line and configured to control an initialization of the second node.

14 Claims, 9 Drawing Sheets

ORGANIC LIGHT EMITTING DISPLAY DEVICE

The present application claims priority under 35 U.S.C. §119(a) of Korean Patent Application No. 10-2011-0127987 filed on Dec. 1, 2011, which is hereby incorporated by reference in its entirety.

BACKGROUND

1. Field of the Disclosure

The present application relates to an organic light emitting display device.

2. Description of the Related Art

Devices for displaying information are being widely developed. The display devices include liquid crystal display devices, organic light-emitting display devices, electrophoresis display devices, field emission display devices, and plasma display devices.

Among these display devices, organic light-emitting display devices have the features of lower power consumption, wider viewing angle, lighter weight and higher brightness compared to the liquid crystal display devices. As such, the organic light-emitting display device is considered to be next generation display devices.

Thin film transistors used in the organic light-emitting display device can be driven in high speed. To this end, the thin film transistors increase carrier mobility using a semiconductor layer which is formed from polysilicon. Polysilicon can be derived from amorphous silicon through a crystallizing process.

A laser scanning mode is widely used in the crystallizing process. During such a crystallizing process, the power of a laser beam can be unstable. As such, the thin film transistors formed on the scanned line, which is scanned by the laser beam, can have different threshold voltages from each other. This can cause image quality to be non-uniform between pixel regions.

To address this matter, a technology detecting the threshold voltages of pixel regions and compensating for the threshold voltages of thin film transistors had been proposed.

However, in order to realize such threshold voltage compensation, not only a transistor for detecting the threshold voltage must be added into the pixel region but also signal lines used for controlling the thin film transistors must be added. Due to this, the pixel region becomes complex, and furthermore an aperture of the pixel region decreases.

SUMMARY

Accordingly, embodiments of the present application are directed to an organic light-emitting display device that substantially obviates one or more of problems due to the limitations and disadvantages of the related art.

The embodiments are to provide an organic light-emitting display device with an enhanced aperture ratio.

Also, the embodiments are to provide an organic light-emitting display device that is adapted to reduce power consumption.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a first general aspect of the present embodiment, an organic light-emitting display device is defined into a non-display area and a display area provided with pixels. Each of the pixels includes: first through fourth nodes; an organic light emission element connected to the fourth node; a drive transistor disposed between the second, third, and fourth nodes and configured to generate a drive current which drives the organic light emission element to emit light; a storage capacitor disposed between the first and third nodes; a first transistor disposed between the first and second nodes and configured to selectively transfer a data voltage; a second transistor disposed between the third and fourth nodes and configured to sense a threshold voltage of the drive transistor; a third transistor disposed between the first node and a data line and configured to selectively transfer the data voltage from the data line to the first node; a fourth transistor disposed between the second node and a power line and configured to selectively transfer a power voltage from the power line to the second node; and a fifth transistor disposed between the second node with the non-display area and a reference voltage line and configured to control an initialization of the second node.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
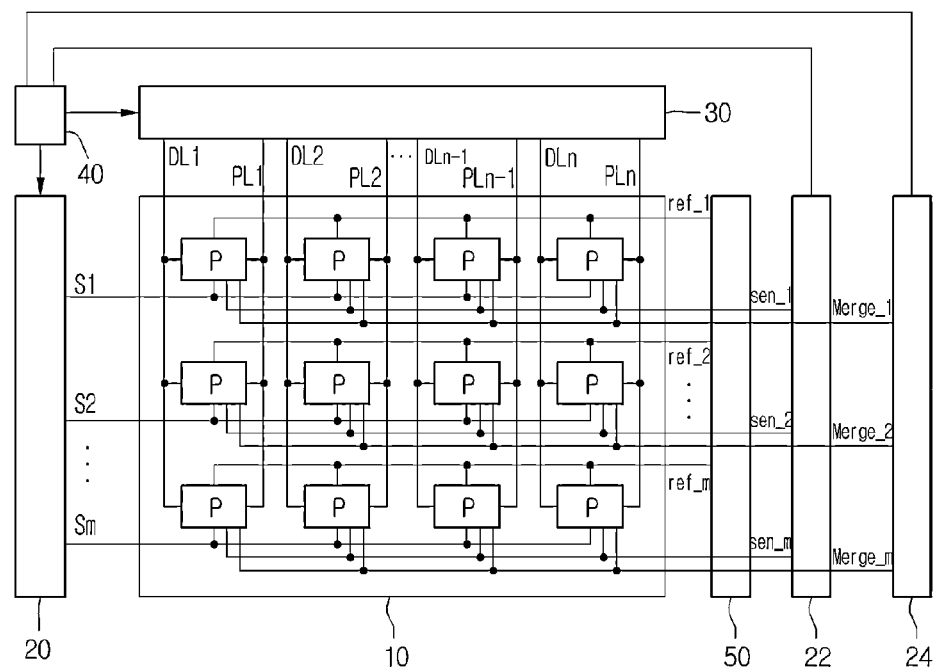
FIG. 1 is a block diagram showing an organic light-emitting display device according to an embodiment of the present disclosure.

In the present disclosure, it will be understood that when an element, such as a substrate, a layer, a region, a film, or an electrode, is referred to as being formed "on" or "under" another element in the embodiments, it may be directly on or under the other element, or intervening elements (indirectly) may be present. The term "on" or "under" of an element will be determined based on the drawings.

Reference will now be made in detail to the present embodiments, examples of which are illustrated in the accompanying drawings. In the drawings, the sizes and thicknesses of elements can be exaggerated, omitted or simplified for clarity and convenience of explanation, but they do not mean the practical sizes of elements.

FIG. 1 is a block diagram showing an organic light-emitting display device according to an embodiment of the present disclosure.

Referring to FIG. 1, the organic light-emitting display device according to an embodiment of the present disclosure can include an organic light-emitting panel 10, a scan driver 20, a sensing control line driver 22, a merge line driver 24, a data driver 30, a controller 40 and a reference voltage supplier 50.

The organic light-emitting panel 10 can include a plurality of scan lines S1~Sm, a plurality of data lines DL1~DLn, a plurality of power lines PL1 through PLn, a plurality of reference voltage lines Ref_1 through Ref_m, a plurality of sensing control lines sen_1 through sen_m and a plurality of merge lines Merge_1 through Merge_m. Although it is not shown in the drawing, the organic light-emitting panel 10 can further include a plurality of additional signal lines, if necessary.

A plurality of pixel regions P can be defined by the scan lines S1 through Sm and data lines DL1 through DLn which are crossed with each other. These pixel regions P can be arranged in a matrix shape. Each of the pixel regions P can be electrically connected to one of the scan line S1 through Sm, one of the data line DL1 through DLn, one of the plurality of power lines PL1 through PLn, one of the plurality of reference voltage lines Ref_1 through Ref_m, one of the plurality of sensing control lines sen_1 through sen_m and one of the plurality of merge lines Merge_1 through Merge_m.

For example, the scan line S1 through Sm, the plurality of power lines PL1 through PLn, the plurality of reference voltage lines Ref_1 through Ref_m, the plurality of sensing control lines sen_1 through sen_m and the plurality of merge lines Merge_1 through Merge_m can be electrically connected to the plurality of pixel regions P arranged in a horizontal direction. The data line DL1 through DLn can be electrically connected to the plurality of pixel regions P arranged in a vertical direction.

The scan driver 20 can apply scan signals to the pixel regions P through the scan lines S1 through Sm. The data driver 30 can apply data voltages and a power voltage to the pixel regions P through the data lines DL1 through DLn and the power lines PL1 through PLn. The power voltage can be applied to the data driver 30. The power voltage can be generated in a separated power supplier (not shown) and applied to the data driver 30.

The sensing control line driver 22 can apply sensing control signals to the pixel regions P via the sensing control lines sen_1 through sen_m. The merge one driver 24 can apply merge control signals to the pixel regions P via the merge lines Merge_1 through Merge_m. The reference supplier 50 can apply a reference voltage to the pixel regions P via the reference voltage lines Ref_1 through Ref_m.

The timing controller 40 can apply digital video data RGB to the data driver 30. Also, timing controller 40 can derive timing control signals from vertical/horizontal synchronous signals and a clock signal. The timing control signals are used to control operation timings of the scan driver 20, the sensing control line driver 22, the merge line driver 24, the data driver 30 and the reference voltage supplier 50. As such, the timing control signals can be applied from the timing controller 40 to the scan driver 20, the sensing control line driver 22, the merge line driver 24, the data driver 30 and the reference voltage supplier 50.

The organic light-emitting display device includes a display area used to display images and a non-display area in which any image is not displayed. The organic light-emitting panel 10 can be included in the display area. The scan driver 20, the sensing control line driver 22, the merge line driver 24, the data driver 30, the timing controller 40 and the reference voltage supplier 50 can be included in the non-display area.

Figure 2:
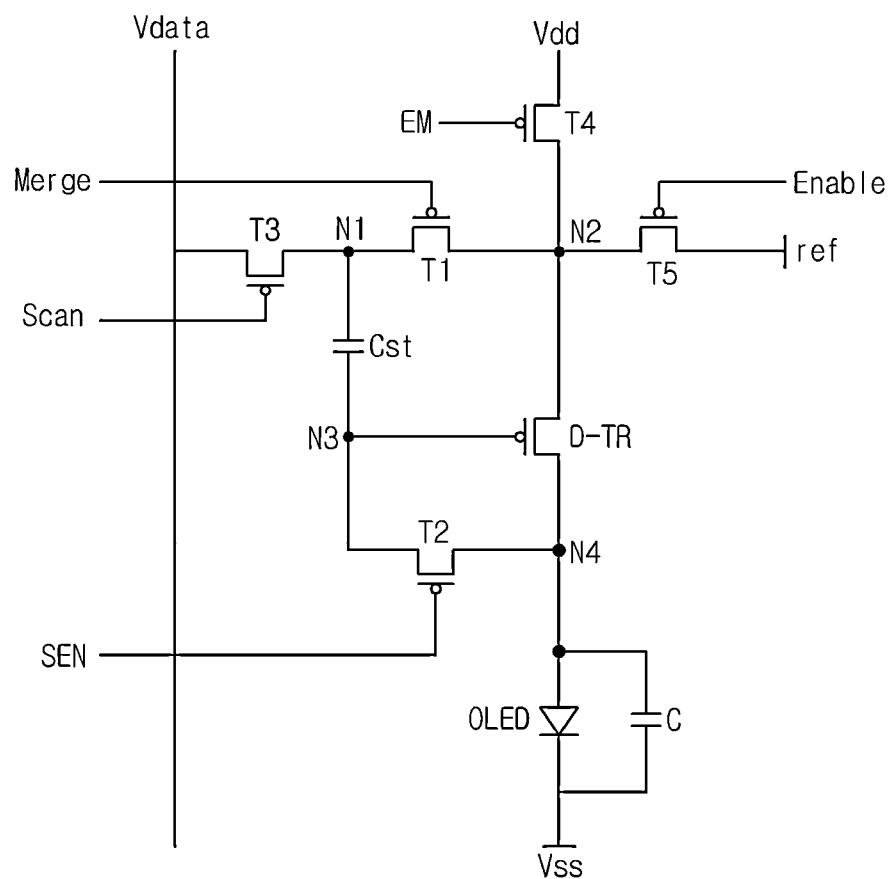
FIG. 2 is a circuit diagram showing a pixel region of the organic light-emitting display device according to an embodiment of the present disclosure.

FIG. 2 is a circuit diagram showing a pixel region of the organic light-emitting display device according to an embodiment of the present disclosure.

Referring to FIG. 2, the pixel region P of the organic light-emitting display device according to an embodiment of the present disclosure can include: an organic light emission element OLED; a capacitor C configured to protect the light emission element OLED from an over inverse voltage, a drive transistor D-TR configured to drive the organic light emission element OLED, a storage capacitor Cst configured to maintain the data voltage Vdata, which will be applied to the organic light emission element OLED, during a single frame, and first through fifth transistors T1 through T5.

The first transistor T1 can be turned-on in response to a merge signal Merge and transfer the data voltage Vdata on a first node N1 to a second node N2.

The second transistor T2 can be turned-on in response to a sensing control signal SEN and enable a threshold voltage of the drive transistor D-TR to be sensed.

The third transistor T3 can be turned-on in response to the scan signal Scan and transfer the data voltage Vdata on the data line DL to the first node N1.

The fourth transistor T4 can be turned-on in response to an emission control signal EM and transfer a power voltage Vdd on the power line PL to the drive transistor D-TR.

The fifth transistor T5 can be turned-on in response to an enable signal Enable and transfer a reference voltage "ref" on the reference voltage line Ref to a second node N2.

The first through fifth transistors T1~T5 can be PMOS-type transistors. As such, the first through fifth transistors T1~T5 can be turned-on when the scan signal Scan, the sensing control signal SEN, the merge signal Merge, the emission control signal EM and the enable signal Enable each have a low level. On the contrary, the first through fifth transistors T1~T5 can be turned-off when the scan signal Scan, the sensing control signal SEN, the merge signal Merge, the emission control signal EM and the enable signal Enable each has a high level.

In detail, the third transistor T3 can be turned-on when the scan signal Scan has the low level. The second transistor T2 can be turned-on when the sensing control signal SEN has the low level. The first transistor T1 can be turned-on when the merge signal Merge has the low level. The fourth transistor T4 can be turned-on when the emission control signal EM has the low level. The fifth transistor T5 can be turned-on when the enable signal Enable has the low level.

Although it is explained the first through fifth transistors T1~T5 are PMOS transistors, the present embodiment is not limited to this. In other words, the first through fifth transistors T1~T5 can be NMOS transistors.

Also, the drive transistor D-TR can be one of PMOS and NMOS transistors.

The data voltage Vdata can vary along a gray level which will be reproduced.

The power voltage Vdd can be a direct current (DC) voltage maintaining a constant level.

The reference ref can selectively have two voltage levels. In other words, the reference voltage ref can be switched between an initialization mode voltage and a sensing mode voltage. The initialization mode voltage can be set to be a negative level voltage. The sensing mode voltage can be set to be higher than the initialization mode voltage. For example, the sensing mode voltage can be either 0V or a positive level voltage. This method of switching the reference voltage ref between the two mode voltages can greatly reduce power consumption, compared to the related art method of switching the power voltage Vdd.

The first transistor T1 includes a gate electrode electrically connected to the merge line, which is used to transfer the merge signal Merge, a source electrode electrically connected to the first node N1, and a drain electrode electrically connected to the second node N2. This first transistor T1 is turned-on by the merge signal Merge with the low level, and electrically connects the first and second nodes N1 and N2 to each other. As such, the data voltage on the first node N1 can be transferred to the second node N2.

The second transistor T2 includes a gate electrode electrically connected to the sensing control line, which is used to transfer the sensing control signal SEN, a source electrode electrically connected to the third node N3, and a drain electrode electrically connected to the fourth node N4. Such a second transistor T2 is turned-on by the sensing control signal SEN with the low level, and electrically connects gate and drain electrodes of the drive transistor D-TR to each other. In accordance therewith, a threshold voltage of the drive transistor D-TR can be detected.

The third transistor T3 includes a gate electrode electrically connected to the scan line which is used to transfer the scan signal Scan, a source electrode electrically connected to the data line which is used to transfer the data voltage Vdata, and a drain electrode electrically connected to the first node N1. This third transistor T3 is turned-on by the scan signal Scan with the low level, and electrically connects the data line and first node N1 to each other. As such, the data voltage Vdata on the data line can be transferred to the first node N1 through the third transistor T3.

The fourth transistor T4 includes a gate electrode electrically connected to the emission control line which is used to transfer the emission control signal EM, a source electrode electrically connected to the power line which is used to transfer the power voltage Vdd, and a drain electrode electrically connected to the second node N2. Such a fourth transistor T4 is turned-on by the emission control signal EM with the low level, and electrically connects the power line and second node N2 to each other. As such, the power voltage Vdd on the power line can be transferred to a source electrode of the drive transistor D-TR through the fourth transistor T4 and the second node N2.

In accordance therewith, a drive current can flow from the drive transistor D-TR into the organic light emission element OLED. The organic light emission element OLED can emit light by the drive current. The brightness or gray level realized by the organic light emission element OLED can be depend on the intensity of the drive current generated in the drive transistor D-TR.

When the fourth transistor T4 is turned-on by the emission control signal EM with the high level, the drive transistor D-TR is disconnected from the power line. As such, the power voltage Vdd is not applied to the drive transistor D-TR, and the organic light emission element OLED does not emit light in the rest intervals without a light emission interval. In other words, the fourth transistor T4 is turned-off in an initialization interval, a sensing interval and a data writing interval, but turned-on in the light emission interval.

The fifth transistor T5 includes a gate electrode electrically connected to the enable line which is used to transfer the enable signal Enable, a source electrode electrically connected to the reference voltage line which is used to transfer the reference voltage ref, and a drain electrode electrically connected to the second node N2. This fifth transistor T5 is turned-on by the enable signal Enable with the low level, and electrically connects the reference voltage line and second node N2 to each other. As such, the reference voltage ref on the reference voltage line can be transferred to the second node N2 through the fifth transistor T5.

Such a reference voltage ref can be switched between an initialization mode voltage, which is used for an initialization of the first through third nodes N1 through N3, and a sensing mode voltage used to detect the threshold voltage of the drive transistor D-TR. As such, the drive transistor D-TR is initialized when the reference voltage ref is the initialization mode voltage. Also, when the reference voltage ref becomes the sensing mode voltage, a threshold voltage of the drive transistor D-TR can be sensed based on the sensing mode voltage.

In brief, the first transistor T1 disposed between the first and second nodes N1 and N2 can transfer the data voltage at the first node N1 to the second node N2. The second transistor T2 disposed between the third and fourth nodes N3 and N4 can detect the threshold voltage of the drive transistor D-TR. The third transistor T3 disposed between the data line and the first node N1 can control the data voltage Vdata on the data line to be applied to the first node N1. The fourth transistor T4 disposed between the power line and the second node N2 can control the power voltage Vdd on the power line to be applied to the second node N2. The fifth transistor T5 disposed between the reference voltage line and the second node N2 can control the reference voltage ref on the reference voltage line to be applied to the second node N2. Such first through fifth transistors T1 through T5 can be turned-on in different intervals from one another.

The first through fourth transistors T1 through T4 can be formed in a pixel region P. Meanwhile, the fifth transistor T5 can be included in the power supplier 22 shown in FIG. 1. The power supplier 22 is disposed in the non-display area. As such, the fifth transistor T5 does not affect the aperture ratio of the pixel region of the organic light-emitting display device. In other words, the organic light-emitting display device of the present embodiment forces the fifth transistor T5 used for the threshold voltage compensation and the initialization to be disposed in the non-display area. In accordance therewith, the pixel region P can be relatively large, and furthermore the aperture ratio of the pixel region can increase.

As a result, picture quality of the organic light emitting display device can be enhanced.

Figure 3:
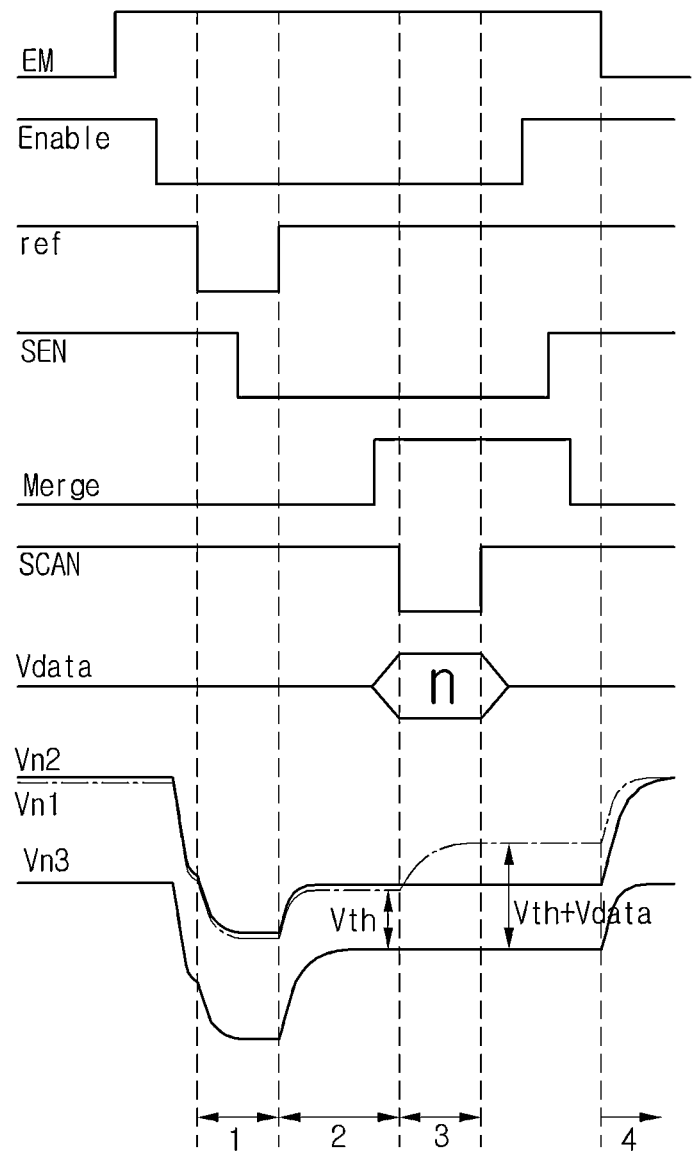
FIG. 3 is a waveform diagram illustrating signals applied to a pixel region of the OLED device according to an embodiment of the present disclosure.

FIG. 3 is a waveform diagram illustrating signals applied to a pixel region of the OLED device according to an embodiment of the present disclosure. FIGS. 4A through 4D are circuit diagrams showing switching states of transistors when the pixel region is driven in time intervals.

As shown in FIG. 3, drive signals applied to the pixel region P can have different waveforms in an initialization interval 1, a sensing interval 2, a data writing interval 3 and a light emission interval 4.

Figure 4A:
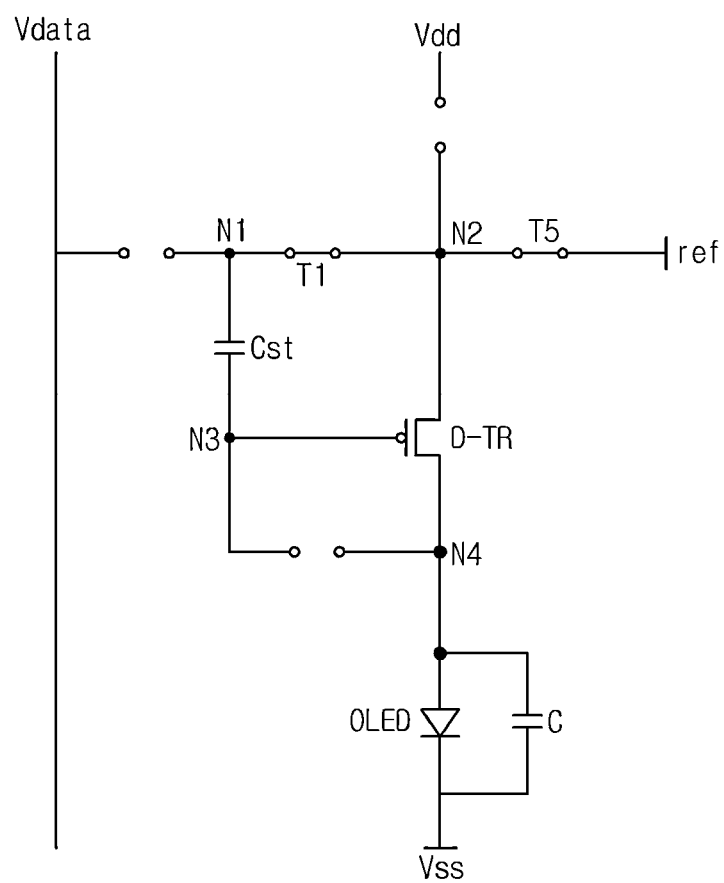
FIGS. 4A through 4D are circuit diagrams showing switching states of transistors when the pixel region is driven in time intervals.

Referring to FIG. 4A, in the initialization interval 1, the first transistor T1 and the fifth transistor T5 can be turned-on by the merge signal Merge and the enable signal Enable which each has the low level. Meanwhile, because the sensing control signal SEN, the scan signal SCAN and the emission control signal EM each has the high level, the second through fourth transistors T2 through T4 can be turned-off.

The initialization mode voltage used for the initialization can be applied to the reference voltage line during the initialization interval 1. In other words, the reference voltage ref can become the initialization mode voltage during the initialization interval 1.

The enable signal Enable with the low level enables the reference voltage ref on the reference voltage line to be applied to the second node N2 through the fifth transistor T5. In other words, the enable signal Enable can allow the second node N2 to be initialized with the initialization mode voltage.

The first transistor T1 turned-on by the merge signal Merge with the low level can transfer the initialization mode voltage at the second node N2 to the first node N1.

The initialization mode voltage applied to the first and second nodes N1 and N2 initializes the data voltage of a previous frame which is stored in the storage capacitor Cst. At this time, the storage capacitor Cst is charged with the initialization mode voltage. As such, the initialization of the drive transistor D-TR can be completely and rapidly performed. In accordance therewith, the sensing mode level voltage can be applied to the drive transistor D-TR without any distortion, and furthermore the threshold voltage of the drive transistor D-TR can be accurately sensed or detected. As a result, the organic light emission element OLED can emit light corresponding to a desired gray level.

During the initialization interval, the data voltage Vdata and the power voltage Vdd are not applied to the reference voltage line because the third and fourth transistors T3 and T4 are turned-off. As such, an over-current does not flow through the reference voltage line.

The reference voltage ref must be set to be lower than a turning-on voltage of the organic light emission element OLED. As such, the organic light emission element OLED does not emit light even though the initialization mode voltage used as a reference voltage ref is applied to the organic light emission element OLED via the drive transistor D-TR. The turning-on voltage of the organic light emission element OLED can be defined as a minimum voltage allowing the organic light emission element OLED to emit light.

Figure 4B:
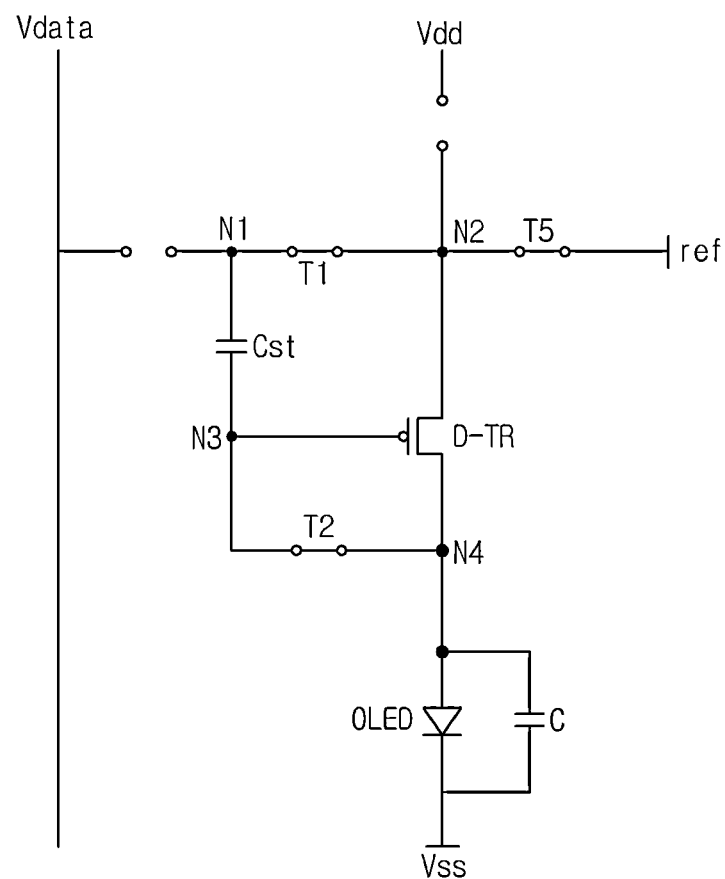

As shown in FIG. 4B, the first transistor T1, the second transistor T2 and the fifth transistor T5 can be turned-on by the merge signal Merge, the sensing control signal SEN and the enable signal Enable, which each has the low level, in the sensing interval 2. Meanwhile, the third and fourth transistors T3 and T4 can be turned-off because the scan signal SCAN and the emission control signal EM each has the high level.

During the sensing interval 2, the sensing mode voltage can be applied to the reference voltage line. In other words, the reference voltage can become the sensing mode voltage during the sensing interval 2. The sensing mode voltage can be set to be 0V, as an example.

The enable signal Enable with the low level enables the reference voltage ref on the reference voltage line to be applied to the second node N2. In detail, the sensing mode voltage can be applied from the reference voltage line to the second node N2 via the fifth transistor 15 which is turned-on by the enable signal Enable with the low level.

The sensing mode level voltage can be also applied from the second node N2 to the first node N1 because the first transistor T1 is turned-on by the merge signal Merge with the low level.

The second transistor T2 turned-on by the sensing control signal SEN with the low level enables the drive transistor D-TR to be a diode-connected transistor. As such, the threshold voltage Vth of the drive transistor D-TR can be detected (or sensed) and stored at the third node N3.

Figure 4C:
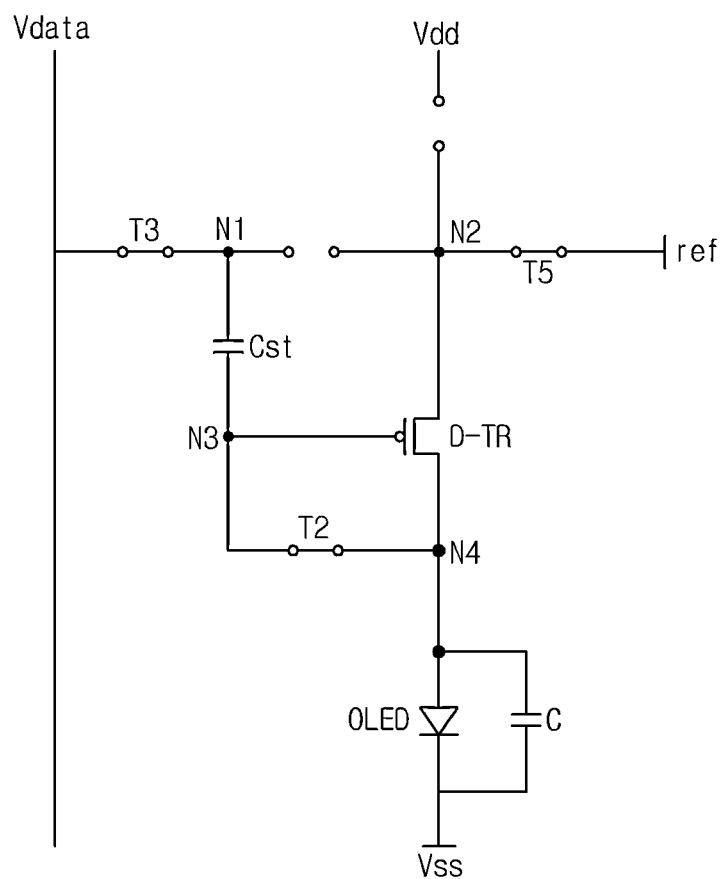

Referring to FIG. 4C, in the data writing interval, the second and third transistors T2 and T3 and the fifth transistor T5 can be turned-on by the sensing control signal SEN, the scan signal SCAN and the enable signal Enable which each has the low level. Meanwhile, the first and fourth transistors T1 and T4 can be turn-off by the merge signal Merge and the emission control signal EM which each has the high level.

The data voltage Vdata on the data line can be transferred to the first node N1 via the third transistor T3 which is turned-on by the scan signal SCAN with the low level. Also, the data voltage Vdata transferred to the first node N1 can be stored into the storage capacitor Cst. At this time, the data voltage is compensated with the threshold voltage Vth of the drive transistor D-TR detected in the sensing interval 2. The compensated data voltage is developed at the first node N1. As such, the drive current applied from the drive transistor D-TR to the organic light emission element OLED can depend on the data voltage Vth regardless of the threshold voltage Vth of the drive transistor D-TR. In accordance therewith, brightness non-uniformity can be prevented even though the drive transistors D-TR of the pixel regions have different threshold voltages Vth from one another.

On the other hand, the data voltage Vdata is not transferred from the first node N1 to the second node N2 because the first transistor T1 is turned-off by the merge signal Merge with the low level. However, the reference voltage ref on the reference voltage line is transferred to the second node N2 via the fifth transistor T5 which is turned-on by the enable signal Enable with the low level. As such, similarly to the sensing interval, the sensing mode level voltage is applied to the second node N2.

Figure 4D:
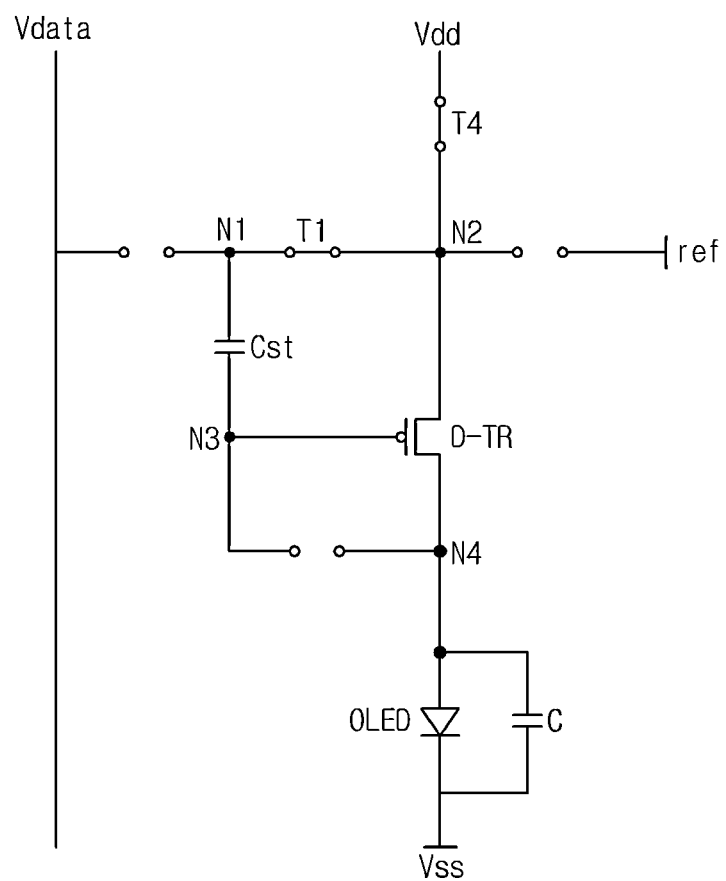

As shown in FIG. 4D, the first transistor T1 and the fourth transistor T4 can be turned-on by the merge signal Merge and the emission control signal EM which each have the low level. On the other hand, the second and third transistor T2 and T3 and the fifth transistor T5 can be turned-off because the sensing control signal SEN, the scan signal SCAN and the enable signal Enable are in the high level.

The power voltage Vdd on the power line can be applied to the second node N2 via the fourth transistor T4 which is turned-on by the emission control signal EM with the high level. As such, a drive current in accordance with the data voltage Vdata stored in the storage capacitor Cst is applied to the organic light emission element OLED. Therefore, the organic light emission element OLED can emit a quantity of light corresponding to a desired gray level.

Figure 5A:
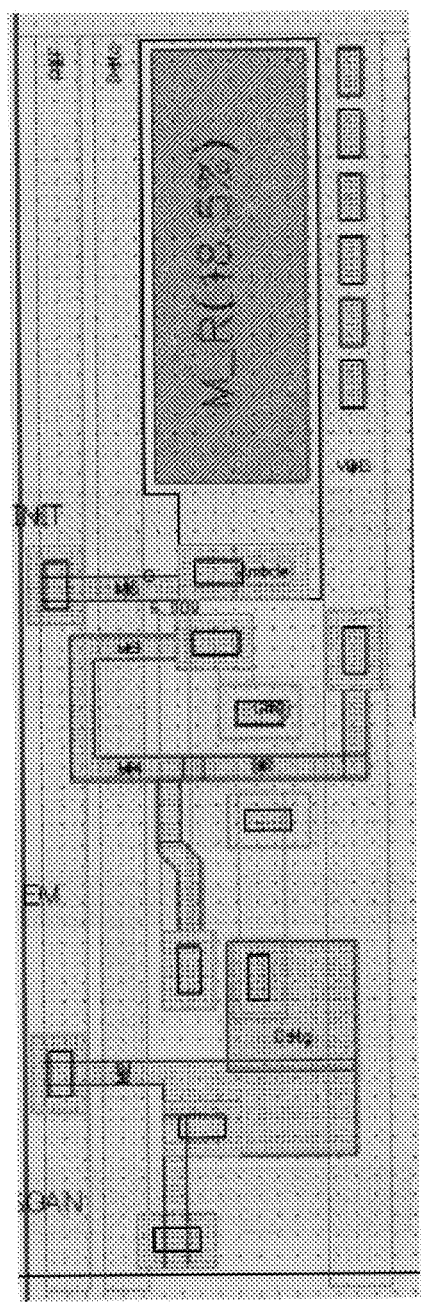
FIGS. 5A and 5B are layouts showing organic light-emitting display devices.
Figure 5B:
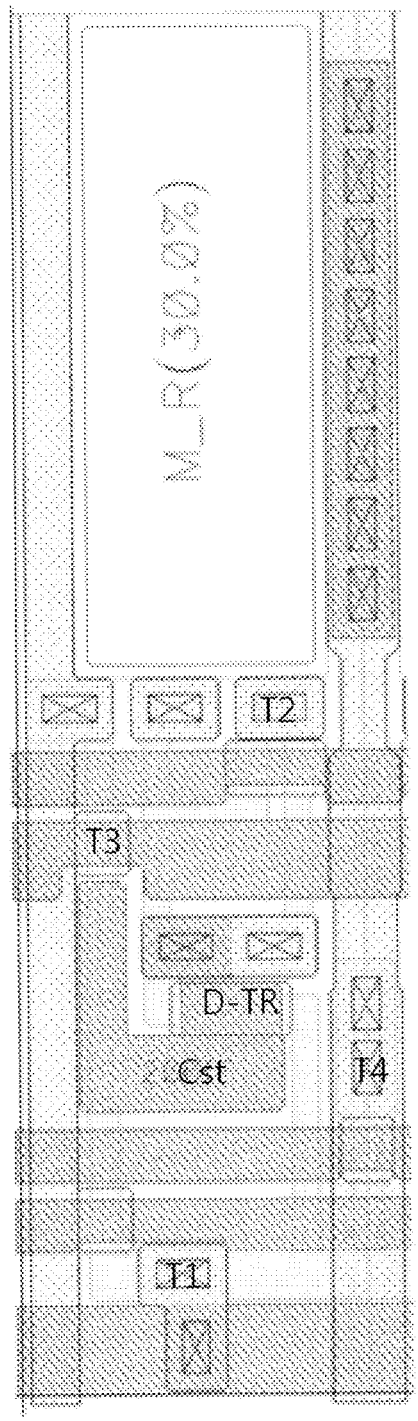

FIGS. 5A and 5B are layouts showing OLED devices. FIG. 5A is a layout showing an organic light-emitting display device according to an embodiment of the present disclosure. FIG. 5b is a layout showing an organic light-emitting display device of the related art.

Referring to FIG. 5A, the organic light-emitting display device of the related art is configured with six transistors and a single capacitor. The six transistors and the single capacitor are formed within a non-display domain of the pixel region P. The pixel region of the related art organic light-emitting display device has an aperture ratio of 18.5% as shown in FIG. 5A.

As shown in FIG. 5B, the organic light-emitting display device of the present embodiment can include first through fourth transistors T1 through T4, a drive transistor D-TR and a storage capacitor Cst. In other words, the organic light-emitting display device of the present embodiment can allow five transistors and a single capacitor to be formed in a non-display domain of the pixel region P. However, the fourth transistor is positioned on the power line and does not affect the non-display domain of the pixel region at all. As such, it can be provided the same effect as only four transistors and the single capacitor are formed within the non-display domain of the pixel region. Therefore, the pixel region of the organic light-emitting display device according the present embodiment can have an aperture ratio of 30.0% as shown in FIG. 5B.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display device comprising:
   a pixel disposed in a display area of the organic light emitting display device, the pixel comprising:
   first through fourth nodes;
   an organic light emission element connected to the fourth node;
   a drive transistor disposed between the second, third, and fourth nodes to generate a drive current which drives the organic light emission element to emit light;
   a storage capacitor disposed between the first and third nodes;
   a first transistor disposed between the first and second nodes;
   a second transistor disposed between the third and fourth nodes;
   a third transistor disposed between the first node and a data line to selectively transfer a data voltage from the data line to the first node; and
   a fourth transistor directly connected to the second node and a power line to selectively transfer a power voltage from the power line to the second node; and
   a fifth transistor disposed in a non-display area of the organic light emitting display device, a drain electrode of the fifth transistor connected to the second node and a source electrode of the fifth transistor connected to a reference voltage line to control an initialization of the second node.

2. The organic light emitting display device of claim 1, wherein
   the first transistor is connected to a merge line,
   the second transistor is connected to a sensing control line, and
   the third transistor is connected to a scan line.

3. The organic light emitting display device of claim 1, wherein
   the fourth transistor is electrically connected to an emission control line, and
   the fifth transistor is electrically connected to an enable line.

4. The organic light emitting display device of claim 1, wherein the fourth transistor is formed on the power line.

5. The organic light emitting display device of claim 1, wherein the reference voltage line selectively transfers one of a sensing mode voltage and an initialization mode voltage.

6. The organic light emitting display device of claim 5, wherein the first through fifth transistors and the drive transistor are driven according to an initialization interval, a sensing interval, a data writing interval, and an emission interval.

7. The organic light emitting display device of claim 6, wherein in the initialization interval, the first and fifth transistors are turned-on and the second, third, and fourth transistors are turned-off to initialize the first, second, and third nodes.

8. The organic light emitting display device of claim 7, wherein in the sensing interval, the first, second, and fifth transistors are turned-on and the third and fourth transistors are turned-off to detect the threshold voltage of the drive transistor.

9. The organic light emitting display device of claim 8, wherein in the data writing interval, the second, third, and fifth transistors are turned-on but the first and fourth transistors are turned-off to transfer the data voltage from the data line to the first node.

10. The organic light emitting display device of claim 9, wherein in the emission interval, the first and fourth transistors are turned-on but the second, third, and fifth transistors are turned-off to transfer the drive current from the drive transistor to the organic light emission element.

11. The organic light emitting display device of claim 7, wherein the initialization mode voltage is applied to the second node in the initialization interval.

12. The organic light emitting display device of claim 1, wherein the first through fifth transistors are PMOS transistors.

13. The organic light emitting display device of claim 1, wherein the fifth transistor includes a power supplier.

14. The organic light emitting display device of claim 1, wherein the drain electrode of the fifth transistor is directly connected to the second node.

* * * * *